(12) United States Patent
Srinivasan et al.

(10) Patent No.: US 6,544,892 B2
(45) Date of Patent: *Apr. 8, 2003

(54) SLURRY FOR CHEMICAL MECHANICAL POLISHING SILICON DIOXIDE

(75) Inventors: Ramanathan Srinivasan, Penn Yan, NY (US); Suryadevara V. Babu, Potsdam, NY (US); William G. America, Hilton, NY (US); Yie-Shein Her, Canandaigua, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/192,815

(22) Filed: Jul. 10, 2002

(65) Prior Publication Data

US 2002/0195421 A1 Dec. 26, 2002

Related U.S. Application Data

(60) Division of application No. 09/526,286, filed on Mar. 15, 2000, now Pat. No. 6,491,843, which is a continuation-in-part of application No. 09/456,612, filed on Dec. 8, 1999, now Pat. No. 6,468,910.

(51) Int. Cl.[7] ............................................. H01L 21/302
(52) U.S. Cl. ........................ 438/692; 438/693; 216/88; 216/89
(58) Field of Search ................................ 438/692, 693; 216/88, 89

(56) References Cited

U.S. PATENT DOCUMENTS

| | | | | |
|---|---|---|---|---|
| 5,575,885 A | * | 11/1996 | Hirabayashi et al. | .... 156/626.1 |
| 5,733,819 A | * | 3/1998 | Kodama et al. | ............ 438/692 |
| 5,738,800 A | | 4/1998 | Hosali et al. | ................. 216/99 |
| 5,759,917 A | | 6/1998 | Grover et al. | .............. 438/690 |

(List continued on next page.)

FOREIGN PATENT DOCUMENTS

| | | |
|---|---|---|
| EP | 0 659 858 A2 | 6/1995 |
| EP | 0 786 504 A2 | 6/1997 |
| EP | 0 846 740 A1 | 6/1998 |
| EP | 0 853 335 A2 | 7/1998 |
| JP | 11-349926 | 12/1999 |
| WO | WO 99/53532 | 10/1999 |

OTHER PUBLICATIONS

*Chemical Mechanical Planarization of Microelectronic Materials,* "8.1.2 Shallow Trench Isolation"; by J. M. Steigerwald, S. P. Muraka, and R. J. Gutman; ISBN 0–471–13827–4 (Jon Wiley & Son, Inc. 1997), pp. 273–274.
*A High Oxide: Nitride Selectivity CMP Slurry For Shallow Trench Isolation;* by Sharath Hosali and Ray Lavoie; Electrochemical Society Proceedings, vol. 98–7, pp. 218–234.

(List continued on next page.)

Primary Examiner—George Goudreau
(74) Attorney, Agent, or Firm—Peyton C. Watkins

(57) ABSTRACT

The present invention relates to an aqueous slurry that is particularly useful for removing silicon dioxide in preference to silicon nitride by chemical-mechanical processing. The aqueous slurry according to the invention includes abrasive particles and an organic compound having both a carboxylic acid functional group and a second functional group selected from amines and halides. The present invention also relates to a method of removing silicon dioxide in preference to silicon nitride from a surface of an article by chemical-mechanical polishing. The method includes polishing the surface using a polishing pad, water, abrasive particles, and an organic compound having both a carboxylic acid functional group and a second functional group selected from amines and halides. The abrasive particles can be dispersed in the aqueous medium or they can be bonded to the polishing pad. The aqueous slurry and method of the present invention provide high silicon dioxide to silicon nitride removal rate selectivity over a wide range of pH, which is particularly useful for the fabrication of shallow trench isolation structures on semiconductor devices.

13 Claims, 4 Drawing Sheets

U.S. PATENT DOCUMENTS

| | | | | |
|---|---|---|---|---|
| 5,876,490 | A | 3/1999 | Ronay | 106/3 |
| 6,027,554 | A | 2/2000 | Kodama et al. | 106/3 |
| 6,042,741 | A | 3/2000 | Hosali et al. | 252/79.1 |
| 6,132,637 | A | 10/2000 | Hosali et al. | 252/79.1 |
| 6,218,305 | B1 | 4/2001 | Hosali et al. | 438/691 |
| 6,299,659 | B1 | 10/2001 | Kido et al. | 51/309 |
| 6,436,835 | B1 * | 8/2002 | Kido et al. | 438/693 |

OTHER PUBLICATIONS

*Application of Ceria–Based High Selectivity Slurry to STI CMP for Sub 0.18 μm CMOS Technologies*; by Ki–Sik Choi Sang–Ick Lee, Chang–Il Kim, Chul–Woo Nam, Sam–Dong Kim, and Chung–Tae Kim; CMP–MIC Conference, Feb. 11–12, 1999, pp. 307–313.

*A Production–Proven Shallow Trench Isolation (STI) Solution Using Novel CMP Concepts*; by Raymond R. Jin, Jeffery David, Bob Abbassi, Tom Osterheld, and Fritz Redeker; CMP–MIC Conference, Feb. 11–12, 1999, pp. 314–321.

*A Wide Margin CMP and Clean Process For Shallow Trench Isolation Applications*; by Brad Withers, Eugene Zhao, Rahul Jairath; CMP–MIC Conference, Feb. 19–20, 1998, pp. 319–327.

*Planarization Process and Consumable Development For Shallow Trench Isolation*; by Sharath D. Hosali, et al.; CMP–MIC Conference, Feb. 13–14, 1997, pp. 52–57.

*Pattern Dependence And Planarization Using Silica Or Ceria Slurries For Shallow Trench Isolation*; by D. R. Evans, et al.; CMP–MIC Conference, Feb. 19–20, 1998, pp. 347–350.

*A Two–Step CMP–RIE Planarization Sequence For Advanced Trench Isolation Process*; by Konstantin Smekalin; CMP–MIC Conference, Feb. 13–14, 1997, pp. 21–28.

*Raising Oxide:Nitride Selectivity To Aid In The CMP Of Shallow Trench Isolation Type Applications*; by C.R. Mills, et al.; CMP–MIC Conference, Feb. 13–14, 1997, pp. 179–185.

* cited by examiner

SLURRY FOR CHEMICAL MECHANICAL POLISHING SILICON DIOXIDE

CROSS REFERENCE TO RELATED APPLICATIONS

This is a divisional of Ser. No. 09/526,286 now U.S. Pat. No. 6,491,843 Mar. 15, 2000, which is a Continuation In Part Application of Ser. No. 09/456,612, now U.S. Pat. No. 6,468,910, filed Dec. 8, 1999, by Ramanathan Srinivasan, et al., and entitled, "SLURRY FOR CHEMICAL MECHANICAL POLISHING SILICON DIOXIDE".

FIELD OF THE INVENTION

The present invention relates to an aqueous slurry for use in chemical-mechanical polishing processes. More particularly, the present invention relates to an aqueous slurry that is particularly useful for selectively removing silicon dioxide in preference to silicone nitride from a surface of an article by chemical-mechanical polishing, and a method of removing silicon dioxide in preference to silicon nitride from a surface of an article by chemical-mechanical polishing.

BACKGROUND OF THE INVENTION

Chemical-mechanical polishing ("CMP") is a technology which has its roots in the pre-industrial era. In recent years, CMP has become the technology of choice among semiconductor chip fabricators to planarize the surface of semiconductor chips as circuit pattern layers are laid down. CMP technology is well-known, and is typically accomplished using a polishing pad and a slurry which contains a chemical reagent and abrasive particles. The chemical reagent functions to chemically react with the surface of the layer being polished whereas the abrasive particles perform a mechanical grinding function.

One of the uses of CMP technology is in the manufacture of shallow trench isolation (STI) structures in integrated circuits formed on semiconductor chips or wafers such as silicon. The purpose of an STI structure is to isolate discrete device elements (e.g., transistors) in a given pattern layer to prevent current leakage from occurring between them. Recent technological advancements permitting the fabrication of very small, high density circuit patterns on integrated circuits have placed higher demands on isolation structures.

An STI structure is usually formed by thermally growing an oxide layer on a silicon substrate and then depositing a silicon nitride layer on the thermally grown oxide layer. After deposition of the silicon nitride layer, a shallow trench is formed through the silicon nitride layer and the thermally grown oxide layer and partially through the silicon substrate using, for example, any of the well-known photolithography mask and etching processes. A layer of a dielectric material such as silicon dioxide is then typically deposited using a chemical vapor deposition process to completely fill the trench and cover the silicon nitride layer. Next, a CMP process is used to remove that portion of the silicon dioxide layer covering the silicon nitride layer and to planarize the entire surface of the article. The silicon nitride layer is intended to function as a polishing stop that protects the underlying thermally grown oxide layer and silicon substrate from being exposed during CMP processing. In some applications, the silicon nitride layer is later removed by, for example, dipping the article in an HF acid solution, leaving only the silicon dioxide filled trench to serve as an STI structure. Additional processing is usually then performed to form polysilicon gate structures.

It should be readily apparent that during the CMP step of manufacturing an STI structure on a silicon semiconductor substrate, it would be highly advantageous to use a polishing agent that is capable of selectively removing silicon dioxide in preference to silicone nitride, which is used as the stop layer. Ideally, the rate for removing silicon nitride by CMP would be close to 0 whereas the rate for removing silicon dioxide by CMP would be as high as possible.

Throughout the specification and in the appended claims, the term "selectivity" is used to describe the ratio of the rate at which silicon dioxide is removed to the rate at which silicon nitride is removed by the same polishing agent during a CMP process. Selectivity is determined by dividing the rate at which the silicon dioxide film is removed (usually expressed in terms of nm/min) by the rate at which the silicon nitride film is removed. Conventional CMP slurries occasionally exhibit a silicon dioxide to silicon nitride selectivity of up to about 10, and typically of about 4 or 5.

Keeping the silicon dioxide to silicon nitride selectivity high for a CMP slurry is important. However, suppressing the rate of removal of silicon nitride is probably more important. It is known that the removal rate of the silicon dioxide trench fill material can be made to be quite high by varying polishing conditions such as increasing pad pressure and using various abrasive particles in the slurry. However, these polishing conditions also tend to increase the silicon nitride removal rate, which can affect the uniformity of the final silicon nitride layer thickness and can cause other defects, such as scratching, in the final product. Thus, it is important for a CMP slurry to promote a reasonable silicon dioxide removal rate while, at the same time, inhibiting or suppressing the rate of silicon nitride removal. This too, however, must be done in moderation for some applications. When the selectivity of a CMP slurry is too high coupled with a very low silicon nitride removal rate, other problems, such as dishing of the trench silicon dioxide, can occur, which can result in severe topography variations once the silicon nitride stop layer is removed. Thus, an aqueous slurry should be able to balance these factors in order to be useful in STI processing.

One of the factors that can affect the polishing rate during a CMP process is the pH of the slurry. For some CMP slurries, a slight change in pH can result in a substantial difference in polishing rate and selectivity. It is preferably for a CMP slurry to exhibit a relatively high polishing rate and high selectivity over a broad range of pH.

Most conventional CMP slurries used for polishing oxides typically comprise abrasive particles dispersed in an aqueous alkaline medium (i.e., high pH). Such slurries tend to polish silicon dioxide and silicone nitride at a substantial rate, with a selectivity for silicon dioxide of about 10 or below, and typically at about 4. A few CMP slurries are known which do provide a fairly high silicon dioxide to silicon nitride removal rate selectivity. However, none of the heretofore known CMP slurries exhibit high silicon dioxide to silicon nitride selectivity over a broad range of pH.

Hosali et al., U.S. Pat. No. 5,738,800, discloses a composition for polishing a composite comprised of silicon dioxide and silicon nitride. The CMP slurry according to Hosali et al. comprises an aqueous medium, abrasive particles, a surfactant, and a complexing agent having two or more functional groups each having a dissociable proton that complexes with the silicon dioxide and silicon nitride. The surfactant used in conjunction with the complexing agent in the CMP slurry according to Hosali et al. does not perform the usual function of surfactants (i.e., the stabilization of the particulate dispersion), but rather it is believed by the inventors to affect the rate of removal of silicon nitride from the composite surface. The chemistry of the interaction between the surfactant and the complexing agent is not explained. The composition according to Hosali et al. exhibits selectivity better than conventional CMP slurries, but only within a narrow range of pH (from about 6 to about 7).

Grover et al., U.S. Pat. No. 5,759,917, discloses a CMP slurry for selectively polishing a silicon dioxide overfill in preference to a silicon nitride film stop layer during the manufacture of integrated circuit's and semiconductors. The CMP slurry according to Grover et al. comprises a carboxylic acid, a salt, and a soluble cerium compound at a pH within the range of from about 3 to about 11. The specification of Grover et al. states that a silicon dioxide to silicon nitride removal selectivity of from about 5 to about 100 is obtainable, but the highest reported selectivity in any of the examples in Grover is 34.89, and the substantial majority of the examples yield a selectivity of less than 20.

Kodama et al, EP 0 786 504 A2, discloses a CMP polishing composition comprising silicon nitride particles, water, and an acid. The CMP polishing composition according to Kodama et al. is said to exhibit high selectivity for polishing silicon dioxide relative to silicon nitride. The highest selectivity reported in any of the examples in Kodama et al. is 32.5, and the substantial majority of the examples yield a selectivity of less than 20.

Ronay, EP 0 846 740 A1, discloses a CMP slurry for STI that contains abrasive particles and a polyelectrolyte having a molecular weight of between about 500 and 10,000 such as, for example, polyethylenimine. The pH of the slurry must be kept between 9–11, and there is no information provided regarding whether the CMP slurry according to Ronay provides any degree of selectivity between silicon dioxide and silicon nitride.

Morrison et al., EP 0 853 335 A2, discloses a CMP slurry for STI processing that comprises a mixture of a conventional CMP slurry (typically colloidal silica suspended in an aqueous medium) to which has been added tetramethyl ammonium hydroxide and hydrogen peroxide. The modified CMT slurry according to Morrison et al. is said to improve the typical silicon dioxide to silicon nitride selectivity of 4 to as high as 30. The pH of the slurry must be maintained within a rather narrow range of from about 11 to 12.9.

Several literature references also discuss CMP slurries for use in STI processing. For example, *Chemical Mechanical Planarization of Microelectronic Materials,* by J. M. Steigerwald, S. P. Muraka, and R. J. Gutman, ISBN 0-471-13827-4 (Jon Wiley & Son Inc. 1997), generally discusses the desirability of using STI processing instead of Local Oxidation of Silicon (LOCOS) processing. While this reference teaches that conventional CMP processes have low selectivity between oxides and nitrides, no insight into a potential solution for this problem is taught.

Another literature reference, *A High Oxide:Nitride Selectivity CMP Slurry for Shallow Trench Isolation,* by Sharath Hosali and Ray Lavoie, in Electromechanical Society Proceedings Volume 98-7 (1998), pages 218–234, discloses a slurry that is said to enhance the selectivity rate between silicon oxide and silicon nitride removal by CMP processes. The slurry disclosed in that reference includes cerium oxide as an abrasive with an undisclosed proprietary solution that inhibits the removal rate of the silicon nitride. This references reports that a high rate of selectivity can be obtained for unpatterned silicon wafers. However, the selectivity for patterned silicon wafers is reported to be almost the same as with the conventional CMP slurry it was compared against.

Another literature reference, *Application of Ceria-based High Selectivity Slurry to STI CMP For Sub* 0.18 $\mu$m *CMOS Technologies,* by Ki-Sik Choi, Sang-Ick Lee, Chang-I1 Kim, Chul-Woo Nam, Sam-Dong Kim, and Chung-Tae Kim, CMP-MIC Conference, Feb. 11–12, 1999, pages 307–313, discloses the use of a ceria-based CMP slurry in the process of forming an STI structure, but no specific information is provided regarding how to prepare the slurry. This reference teaches that dummy patterns are required in order to minimize a phenomena known as dishing, which is the formation of shallow depressions in the silicon dioxide filled trenches below the plane of the top surface of silicon nitride stop layer during CMP processing. This reference also reported that there were some problems related to scratches being formed by the ceria abrasive which required filtering to correct.

Yet another literature reference, *A Production-Proven Shallow Trench Isolation (STI) Solution Using Novel CMP Concepts,* by Raymond R. Jin, Jeffery David, Bob Abbassi, Tom Osterheld, and Fritz Redeker, CMP-MIC Conference on Feb. 11–12, 1999, pages 314–321, discusses the problem of having to use dummy patterns to reduce dishing. The solution offered is to employ a low selectivity, or no selectivity, CMP slurry for minimizing dishing during CMP processing in combination with a special system, apparatus, and polishing heads.

Finally, yet another literature reference, *A Wide Margin CMP and Clean Process For Shallow Trench Isolation Applications,* by Brad Withers, Eugene Zhoa, Rahul Jairath, CMP-MIC Conference on Feb. 19–20, 1998, pages 319–327, addresses the problems of process cost and complexity due to the need for block masks, pattern resist etch, high selectivity material overlays or implementation of dummy active areas. No solutions for these problems are provided.

It should be readily apparent from the foregoing discussion that there remains a need within the art for a method of chemical mechanical polishing and a slurry that exhibits high selectivity for silicon dioxide in preference to silicon nitride and that has a wide working range of pH.

SUMMARY OF THE INVENTION

The present invention provides a novel aqueous slurry that is effective over a wide range of pH for selectively removing silicon dioxide in preference to silicon nitride from a surface of an article by chemical-mechanical polishing. The aqueous slurry according to the present invention comprises abrasive particles and an organic compound having both a carboxylic acid functional group and a second functional group selected from amines and halides. In a preferred embodiment, the abrasive particles comprise ceria or titania and the organic compound comprises an $\alpha$-amino acid such as, for example, proline, glycine, or alanine. The aqueous slurry can optionally include acids or bases for adjusting the pH within an effective range of from about 4 to about 12.

The present invention also provides a novel method of selectively removing silicon dioxide in preference to silicon nitride from a surface of an article by chemical-mechanical polishing. The method of the present invention comprises polishing a surface of an article using a polishing pad, water, abrasive particles, and an organic compound having both a carboxylic acid functional group and a second functional group selected from amines and halides. The abrasive particles can be dispersed in the aqueous medium or they can be bonded to the polishing pad.

The novel aqueous slurry and method of the present invention are particularly useful in applications such as, for example, the fabrication of STI structures, where precise control over the silicon dioxide to silicon nitride polishing rate selectivity is critical. The organic compound having both a carboxylic acid functional group and a second functional group selected from amines and halides functions to reduce the rate of silicon nitride removal without significantly reducing the rate of silicon dioxide removal. The removal rate of silicon nitride can be controlled by varying the concentration of the organic compound in the slurry, whereas the removal rate of silicon dioxide can be regulated by changing other CMP conditions, such as abrasive concentration and size, polishing pad down force, and/or speed. Silicon dioxide to silicon nitride removal selectivity can be adjusted within a working range from as low as about 5 to as high as about 500 or more. Many of the compounds used in the aqueous slurry and method according to the present invention are environmentally benign, and thus present minimal considerations in terms of waste water treatment and disposal.

These and other aspects and advantages of the present invention will be readily understood and appreciated by those skilled in the art from the following detailed description of the invention with the best mode contemplated for practicing the invention in view of the accompanying drawings.

DETAILED DESCRIPTION OF THE INVENTION

Figure 1:
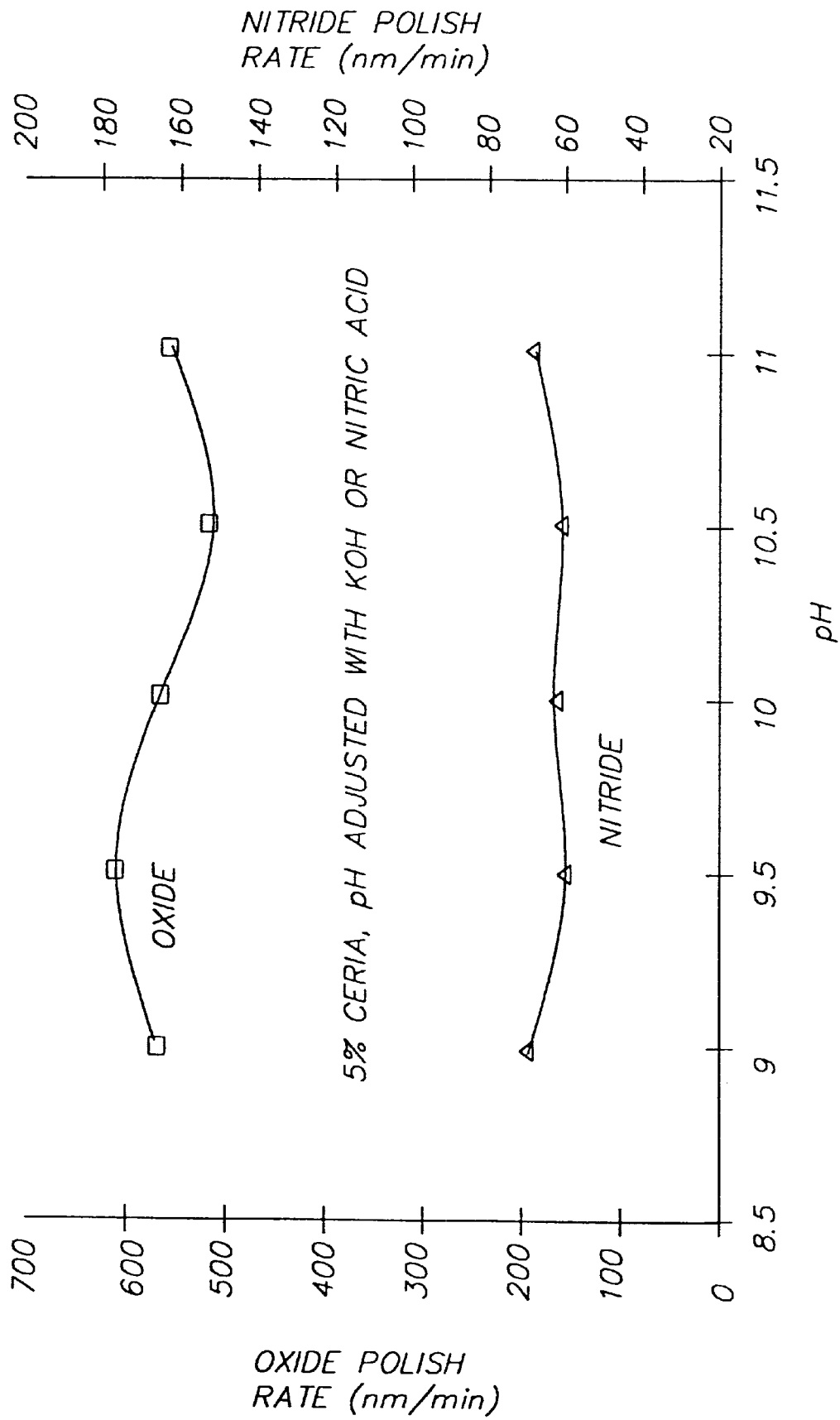
FIG. 1 is a graph showing the silicon dioxide and silicon nitride polishing rate of a conventional CMP slurry as a function of pH.

The aqueous slurry according to the present invention comprises abrasive particles and an organic compound having both a carboxylic acid functional group and a second functional group selected from amines and halides. It will be appreciated that amines and halides are functional groups that do not dissociate protons. Throughout the specification and in the appended claims, the term "halides" is used in this context to refer to both alkyl halides and aryl halides. Amino carboxylic acids are preferred over halo carboxylic acids, because amino acids present little or no handling and disposal concerns.

The abrasive particles used in the aqueous slurry according to the present invention perform the function of mechanical grinding. The abrasive particles used in the aqueous slurry may comprise any one or a mixture of a variety of abrasive particles that are conventionally utilized in CMP slurries. Examples of suitable abrasive particles include alumina, ceria, copper oxide, iron oxide, nickel oxide, manganese oxide, silica, silicon carbide, silicon nitride, tin oxide, titania, titanium carbide, tungsten oxide, yttria, and zirconia, and combinations thereof. Presently, the preferred abrasives are ceria and titania.

The abrasive particles preferably have a mean size ranging from about 0.02 to about 1.0 micrometers, with a maximum size of less than about 10 micrometers. It will be appreciated that while particle size is not per se critical, if the particles are too small, then the polishing rate of the slurry can be unacceptably low. It will also be appreciated that if, on the other hand, the particles are too large, then unacceptable scratching can occur on the surface of the article being polished. The abrasive particles can be present in the slurry in an amount of from about 0.1% to about 60% by weight of the slurry, with the optimal range being from about 0.5% to about 10% by weight of the slurry.

The organic compound having both a carboxylic acid functional group and a second functional group selected from amines and halides performs the function of suppressing the rate of removal of silicon nitride during CMP processing. The organic compound used in the aqueous slurry may comprise any one or a mixture of a variety of organic compounds having both a carboxylic acid functional group and a second functional group selected from amines and halides. Preferably, the second functional group is in the alpha position relative to the carboxylic acid functional group. Amino acids, and more preferably α-amino acids, are presently the preferred organic compounds for use in the invention. L-proline is the presently most preferred α-amino acid for use in the aqueous slurry according to the present invention. Other α-amino acids, and particularly glycine, alanine, arginine, and lysine, are also preferred for use in the invention. The organic compound is preferably present in the aqueous slurry in an amount of from about 0.1 to about 20% by weight, with the optimal range being from about 0.5% to about 10% by weight of the slurry.

The aqueous slurry according to the present invention exhibits high silicon dioxide to silicon nitride removal selectivity over broad range of pH, from as low as about 4 to as high as about 12. Preferably, the pH of the aqueous slurry is within the range of from about 6 to about 11. The pH of the aqueous slurry can be adjusted by the addition of acid or base, as needed. $HNO_3$ is the presently preferred acid for lowering the pH of the aqueous slurry, and KOH and $NH_4OH$ are preferred bases for increasing the pH of the aqueous slurry. It will be appreciated that the selection of a pH adjuster is not critical, and that other acids, such as HCl for example, and bases, such as NaOH for example, can be used in the practice of the invention. The slurry may also contain optional surfactants, pH buffers, anti-foaming agents, and dispersing agents, which are well known.

The silicon dioxide to silicon nitride selectivity of the aqueous slurry according to the present invention can be adjusted from as low as about 5 to as high as about 500 or more. Selectivity is typically adjusted by varying the amount of the organic compound in the slurry. For some applications, such as the planarization of the surface of silicon dioxide film layers on silicon semiconductor wafers during the fabrication of STI structures, a silicon dioxide to silicon nitride selectivity of about 40 to about 60 is preferred if the abrasive particles are dispersed in the aqueous medium. If the abrasive particles are bonded to the polishing pad, then a much-higher selectivity is considered optimal because the problem of "dishing" is considered minimal due to the properties of the polishing pad.

Unexpectedly, it was determined that amino acids have a significant suppressing effect on the rate of silicon nitride removal. Removal rates for the silicon nitride films dropped from about 66 nm/min to about 34 nm/min using 1% glycine (and 4.0% by weight ceria abrasive particles) and to about 1 nm/min with 4% proline (and 4.0% by weight ceria abrasive particles). The silicon nitride polish rate was most suppressed by arginine and lysine where only a 1.0% concentration reduced the silicon nitride polishing rate to 2.0 nm/min and 5.0 nm/min, respectively. The silicon dioxide polish rate is also important since it is necessary to keep the rate reasonably high to remove the excess trench fill oxide in an acceptable period of time. In nearly all cases, the silicon dioxide polishing rate was substantially unaffected by the presence of an amino acid in the slurry.

In general, the effect of increasing the amino acid concentration is a rapid decrease in the silicon nitride removal rate followed by a slowly declining rate in the silicon dioxide removal as the amino acid concentration is further increased. Since the silicon dioxide removal rate remains very high, with a very slowly decreasing trend, the selectively for silicon dioxide over silicon nitride is a fairly linear. Silicon dioxide to silicon nitride selectivity for a 1.0% to a 4.0% (by weight) glycine-ceria slurry ranges from 16 to 70. By comparison, a 1.0% to a 4.0% (by weight) proline-ceria slurry offers an even higher selectivity capable of achieving a selectivity of over 500:1.

The pH of the slurry can have a very strong effect on the selectivity of a slurry, and in particular to proline-ceria slurries. The silicon dioxide removal rate generally increases with pH while the silicon nitride removal rate is essentially constant from a pH of 6 to a pH of 8. As the pH increases from about 8 to just under 10, the silicon nitride removal rate drops dramatically to as low as about 1.0 nm/min for a proline-ceria slurry. The silicon nitride removal rate rapidly increases from pH of 10 to its greatest value (for a proline-ceria slurry) at a pH of 11. Thus, the selectivity for silicon dioxide in preference to silicon nitride in a proline-ceria slurry has a linear section over a broad range of pH from about 6 to 8, has a very large rise throughout the range of pH from about 8 to just under 10, and then falls rapidly from a pH just under 10 to about 11.

A possible mechanism to explain the very strong influence of amino acids on suppressing the silicon nitride removal might be through the formation of a "protection" on the silicon nitride layer top surface. When an appropriate organic compound, such as glycine or proline, is present in the slurry, the organic compound may complex with the Si—OH surface groups of the silicon nitride film and suppress removal. When the pH of the slurry increases from 6 to 8, the association of the organic compound with the silicon nitride surface remains constant, and the silicon nitride removal rate is constant. As the pH is further increased, a greater amount of the organic compound bonds or a stronger complexation of the organic compound with the top molecular layer occurs and removal rate of the silicon nitride film is reduced. It is interesting to note that the measured isoelectric point for silicon nitride is about 8. The suppression of nitride removal continues to pH 9.8 where it begins to increase rapidly. Above pH 10 the complexation strength of the amino acids with the silicon nitride may be significantly reduced or the dissolution rate of the surface Si—OH on the silicon nitride may also increase significantly as with normal silicon dioxide surfaces. The behavior of arginine and lysine to suppress both silicon nitride removal and silicon dioxide removal strongly suggests that the amino groups are the primary functional group involved. Both arginine and lysine have additional amino groups. Further, the dissociation constants for the amino acids investigated are 9.8 for glycine, 10.5 for lysine, 10.6 for proline, and 12.5 for arginine. Except for proline, this is the approximate order of silicon nitride removal rate suppression. Proline may have a slightly stronger effect due to its cyclic structure. The additional amino groups for lysine and arginine may be responsible for the silicon dioxide removal rate suppression. The removal rate for silicon dioxide appears to follow the order of pKa values for amino acids.

The aqueous slurry according to the present invention may be prepared by dispersing the abrasive particles in an aqueous medium either before or after the organic compound has been added. The slurry may also be prepared as a two-component system (i.e., an abrasive dispersed in deionized water component and an organic compound in deionized water component). The slurry may also be prepared in concentrated form needing only the addition of deionized water to dilute the concentrate (or concentrated components in a two-component system) to the desired level.

Alternatively, the aqueous slurry according to the present invention may be formed by incorporating a portion of the components of the slurry in a polishing pad. For example, the abrasive particles and the organic compound could be incorporated directly in the polishing pad, and deionized water could then be added to the pad or the surface of the article being polished to form the polishing slurry in situ. In another alternative embodiment, the abrasive particles could be bonded to the polishing pad, and the organic compound and deionized water could be added either separately or together to the pad or the surface of the article being polished to form the polishing slurry in situ. It will be appreciated that the components of the aqueous slurry according to the invention could be combined in various ways to form the slurry in situ.

It is also possible to form the components of the slurry by combining chemical precursors of the organic compound together either before or at the time of polishing. For example, one could mix ammonia and chloroacetic acid together in a slurry to form glycine in situ. Additionally, one could form the organic compound through the use of an amino acid salt, which would dissociate upon being mixed with deionized water. Thus, as used in the specification and in the appended claims, the term "slurry" should be understood to refer to the components present at the interface between the polishing pad and the surface of the article being polished during chemical-mechanical polishing, and is thus intended to cover situations where precursors are combined to form the organic compound in situ having both a carboxylic acid functional group and a second functional group selected from amines and halides.

The present invention also provides a novel method removing silicon dioxide in preference to silicon nitride from a surface of an article by chemical-mechanical polishing. The method comprises polishing the surface of an article using a polishing pad, water, abrasive particles, and an organic compound having both a carboxylic acid functional group and a second functional group selected from anines and halides. It will be appreciated that the abrasive particles need not necessarily be present as free particles in a slurry, but rather they can be fixedly bonded to the polishing pad.

The following examples are intended only to illustrate the invention and should not be construed as imposing limitations upon the claims:

EXAMPLE 1
(Not An Embodiment of the Invention)

A slurry was formed by dispersing 5.0% by weight ceria particles having an average particle diameter of 350 nm in deionized water. A sufficient amount of 40% by weight KOH was then added to the slurry to adjust the pH to 9.0. Another slurry was formed in the same manner except the pH was adjusted to 9.5. A total of five slurries were prepared so as to have a pH of 9.0, 9.5, 10.0, 10.5, and 11.0.

Blanket silicon wafers (6" diameter) having a 1.0 micron silicon dioxide film layer applied by tetraethylorthosilicate (TEOS) precursor chemical vapor deposition were separately polished with each the five slurries described above using a Strasbaugh 6CA polisher and a Rodel IC1400 K-grooved pad. The polishing conditions were: 5.6 psi down pressure; 0 psi back pressure; 30 rpm table speed; 30 rpm quill speed; 25□C. temperature; and 240 cc/min slurry flow rate. The amount of silicon dioxide removed from the surface of the silicon wafer by CMP was measured using an optical interferometer to determine the rate of removal in terms of nm of silicon dioxide removed per minute.

Blanket silicon wafers (6" diameter) having a 0.3 micron silicon nitride film layer applied by low pressure chemical vapor deposition were separately polished with each of the five slurries described above and the same polishing equipment and conditions. The amount of silicon nitride removed from the surface of the silicon wafer by CMP was measured using an optical interferometer to determine the rate of removal in terms of nm of silicon nitride removed per minute.

Figure 2:
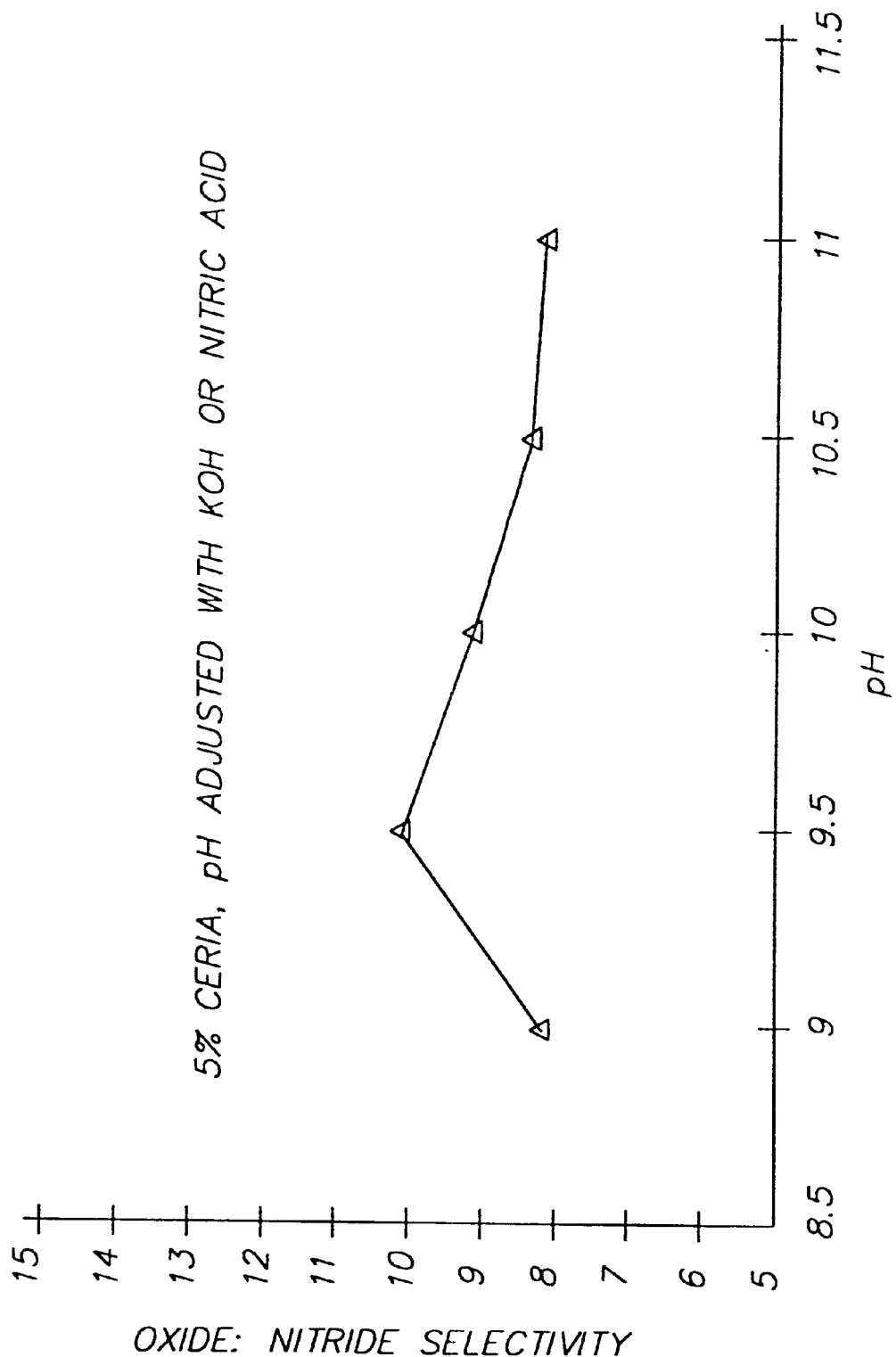
FIG. 2 is a graph showing the silicon dioxide to silicon nitride selectivity of a conventional CMP slurry as a function of pH.

FIG. 1 is a graph showing the polishing rate of silicon dioxide and Silicon nitride as a function of pH for each of the slurries prepared in Example 1. FIG. 2 is a graph showing the silicon dioxide to silicon nitride selectivity as a function of pH for each of the slurries prepared in Example 1. Note that throughout this pH range, a relatively low selectivity of between 8–10 is obtained.

EXAMPLE 2

Five slurries were formed by dispersing 5.0% by weight ceria particles having an average particle diameter of 350 nm in deionized water. Four of the slurries also included an organic compound (an amino acid) in an amount as shown in Table I below. The pH of each slurry was adjusted to 10 by the addition of a sufficient amount of a 40% by weight solution of KOH.

Blanket silicon wafers (6" diameter) having a 1.0 micron silicon dioxide film layer applied by TEOS precursor chemical vapor deposition were separately polished with each the five slurries described above using a Strasbaugh 6CA polisher and a Rodel IC1400 K-grooved pad. The polishing conditions were: 5.6 psi down pressure; 0 psi back pressure; 30 rpm table speed; 30 rpm quill speed, 25□C. temperature; and 240 cc/min slurry flow rate. The amount of silicon dioxide removed from the surface of the silicon wafer by CMP was measured using an optical interferometer to determine the rate of removal in terms of nm of silicon dioxide removed per minute.

Blanket silicon wafers (6" diameter) having a 0.3 micron silicon nitride film layer applied by low pressure chemical vapor deposition were separately polished with each of the five slurries described above and the same polishing equipment and conditions. The amount of silicon nitride removed from the surface of the silicon wafer by CMP was measured using an optical interferometer to determine the rate of removal in terms of nm of silicon nitride removed per minute. The polishing rate and silicon dioxide to silicon nitride selectivity is reported in Table I below.

TABLE 1

| Organic Compound (and conc. in wt. %) | Silicon Dioxide Polishing Rate (nm/min) | Silicon Nitride Polishing Rate (nm/min) | Selectivity |
|---|---|---|---|
| none | 489 | 66 | 7.4 |
| glycine (1%) | 547 | 34 | 16.1 |
| L-alanine (1%) | 545 | 20 | 27.3 |
| L-proline (1%) | 487 | 12 | 40.6 |
| L-proline (4%) | 430 | 2 | 215.0 |

Example 2 demonstrates that an extremely high silicon dioxide to silicon nitride selectivity can be obtained when an organic compound having both a carboxylic acid functional group and a second functional group selected from amines and halides is included in a CMP slurry.

EXAMPLE 3

Sufficient amounts of 40% by weight KOH or 1 N $HNO_3$ were separately added to six slurries formed by dispersing 1.0% by weight ceria particles having an average particle diameter of 350 nm and 2.0% by weight L-proline in deionized water to adjust the pH of the respective slurries to 6.0, 7.0, 8.0, 9.0, 10.0, and 11.0.

Blanket silicon wafers (6" diameter) having a 1.0 micron silicon dioxide film layer applied by TEOS precursor chemical vapor deposition were separately polished with each the six slurries described above using a Strasbaugh 6EC polisher and a Rodel IC1400 K-grooved pad. The polishing conditions were: 6.0 psi down pressure, 2.0 psi back pressure; 40 rpm table speed; 40 rpm quill speed; 20□C. temperature; and 340 cc/min slurry flow rate. The amount of silicon dioxide removed from the surface of the silicon wafers by CMP was measured using an ellipsometer to determine the rate of removal in terms of nm of silicon dioxide removed per minute.

Blanket silicon wafers (6" diameter) having a 0.3 micron silicon nitride film layer applied by low pressure chemical vapor deposition were separately polished with each of the six slurries described above and the same polishing equipment and conditions. The amount of silicon nitride removed from the surface of the silicon wafer by CMP was measured using an ellipsometer to determine the rate of removal in terms of nm of silicon nitride removed per minute.

Figure 3:
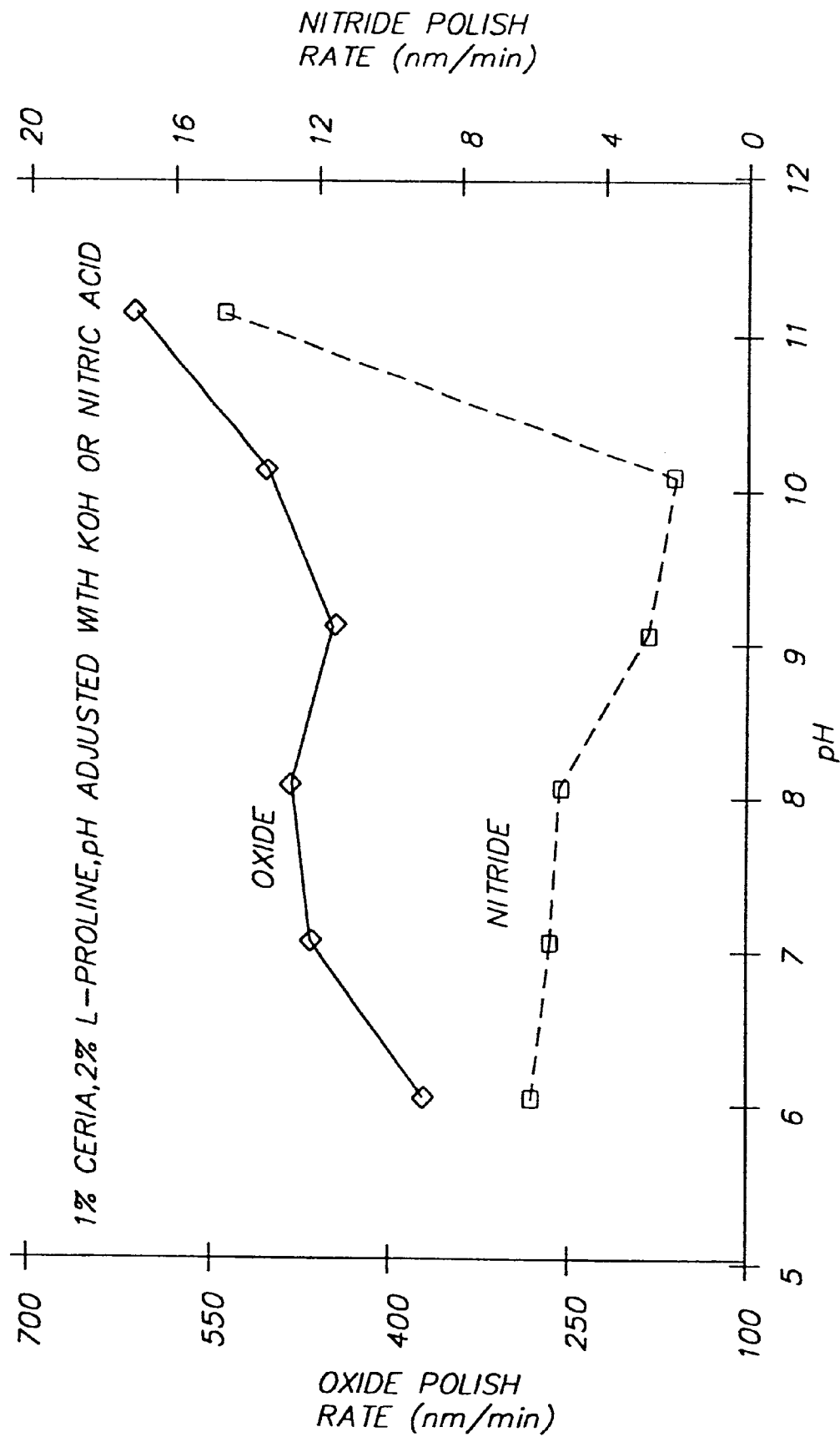
FIG. 3 is a graph showing the silicon dioxide and silicon nitride polishing rate of one embodiment of a CMP slurry according to the present invention as a function of pH.
Figure 4:
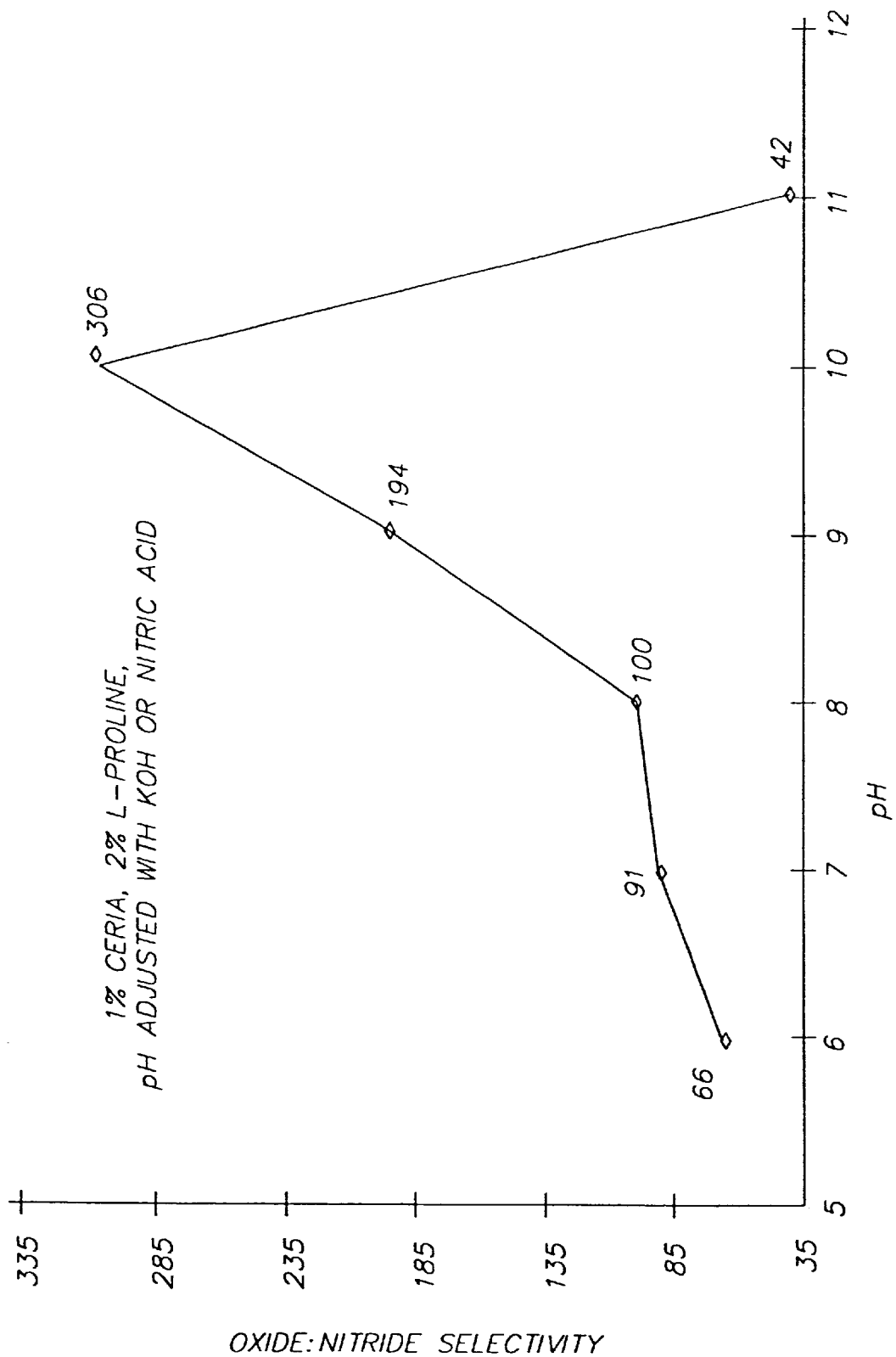
FIG. 4 is a graph showing the silicon dioxide to silicon nitride selectivity of one embodiment of a CMP slurry according to the present invention as a function of pH.

FIG. 3 is a graph showing the polishing rate of silicon dioxide and silicon nitride as a function of pH for each of the slurries prepared in Example 3. FIG. 4 is a graph showing the silicon dioxide to silicon nitride selectivity as a function of pH for each of the slurries prepared in Example 3. Note that the presence of L-proline reduces the polishing rate of silicon nitride dramatically, and that it yields extremely high silicon dioxide to silicon nitride selectivity throughout the broad range of pH.

EXAMPLE 4

Two slurries were formed by dispersing 5.0% by weight titania in deionized water. One of the slurries also included 4.0% by weight of an organic compound (L-proline) as shown in Table II below. The pH of each slurry was adjusted to 10 by the addition of a sufficient amount of a 30% by weight solution of $NH_4OH$.

Blanket silicon wafers (6" diameter) having a 1.0 micron silicon dioxide film layer applied by TEOS precursor chemical vapor deposition were separately polished with each the five slurries described above using a Strasbaugh 6CA polisher and a Rodel IC1400 K-grooved pad. The polishing conditions were: 5.6 psi down pressure; 0 psi back pressure; 40 rpm table speed; 40 rpm quill speed; 25°C. temperature; and 240 cc/min slurry flow rate. The amount of silicon dioxide removed from the surface of the silicon wafer by CMP was measured using an optical interferometer to determine the rate of removal in terms of nm of silicon dioxide removed per minute.

Blanket silicon wafers (6" diameter) having a 0.3 micron silicon nitride film layer applied by low pressure chemical vapor deposition were separately polished with each of the five slurries described above and the same polishing equipment and conditions. The amount of silicon nitride removed from the surface of the silicon wafer by CMP was measured using an optical interferometer to determine the rate of removal in terms of nm of silicon nitride removed per minute. The polishing rate and silicon dioxide to silicon nitride selectivity is reported in Table II below.

TABLE 2

| Organic Compound (and conc. in wt. %) | Silicon Dioxide Polishing Rate (nm/min) | Silicon Nitride Polishing Rate (nm/min) | Selectivity |
| --- | --- | --- | --- |
| none | 57 | 36 | 1.6 |
| L-proline (4%) | 73 | 1 | 73.0 |

Example 4 demonstrates that while the presence of an organic compound is critical to reduce the polishing rate of silicon nitride and thus increase the selectivity of the CMP slurry, the composition of the abrasive particle is not critical.

EXAMPLE 5

A slurry was prepared comprising 5.0% by weight ceria having an average particle size of 350 nm, 4.0% by weight L-proline, and 91.0% by weight deionized water. The pH of the slurry was 7.8 (no optional acids or bases were added to adjust the pH). Blanket silicon semiconductor wafers having a diameter of 6 inches having either 1.0 micron silicon dioxide or 0.3 micron silicon nitride film layers applied thereon by chemical vapor deposition were each separately polished using a Strausbaugh 6CA polisher with a Rodel IC1400 K-grooved pad. The polishing conditions for both wafers were: 5.6 psi down pressure, 0 psi back pressure; 30 rpm table speed; 30 rpm quill speed; 25°C. temperature; and 240 cc/min slurry flow rate. The removal rate for oxide and nitride were calculated by measuring the thickness of the films before and after polishing using an optical interferometer. The polishing rate for silicon dioxide was determined to be 540.1 nm/min, and the polishing rate for silicon nitride was determined to be 1.1 nm/min. Thus, the slurry according to Example 5 exhibited a selectivity of 491.

EXAMPLE 6

Applicants presently regarding the following combination of components and equipment as the best mode for practicing the invention. A slurry was prepared by dispersing 1.0% by weight ceria having an average particle size of 350 nm and 2.0% L-proline in deionized water. The pH of the slurry was determined to be 8.0 without need for adjustment. The surface of blanket silicon semiconductor wafers (6" diameter) having either a silicon dioxide film layer applied by TEOS precursor chemical vapor deposition or a silicon nitride film layer applied by low pressure chemical vapor deposition were polished using a Strasbaugh 6EC polisher and a Rodel IC1400 K-grooved pad. The polishing conditions were: 6.0 psi down pressure; 2.0 psi back pressure; 40 rpm table speed; 40 rpm quill speed, 20°C. temperature; and 340 cc/min slurry flow rate. The polishing rate was 471 nm/min for silicon dioxide, 4.71 nm/min for silicon nitride, thus yielding a selectivity of 100.

The invention has been described in detail with particular reference to certain preferred embodiments thereof, but it will be understood that variations and modifications can be effected within the spirit and scope of the invention.

What is claimed is:

1. A method of removing silicon dioxide in preference to silicon nitride from a surface of an article by chemical-mechanical polishing comprising polishing said surface using a polishing pad, water, abrasive particles, and an organic compound having both a carboxylic acid functional group and a second functional group selected from amines and halides.

2. The method according to claim 1 wherein the second functional group is in the alpha position relative to the carboxylic acid functional group.

3. The method according to claim 1 wherein the organic compound is an amino acid.

4. The method according to claim 3 wherein the amino acid is one or more selected from the group consisting of proline, glycine, alanine, arginine, and lysine.

5. The method according to claim 1 wherein the abrasive particles comprise one or more selected from the group consisting of alumina, ceria, copper oxide, iron oxide, nickel oxide, manganese oxide, silica, silicon carbide, silicon nitride, tin oxide, titania, titanium carbide, tungsten oxide, yttria, and zirconia.

6. The method according to claim 5 wherein the abrasive particles are bonded to the polishing pad.

7. The method according to claim 1 further comprising an acid or a base for adjusting the pH within the range of from about 4 to about 12.

8. The method according to claim 7 wherein the acid comprises $HNO_3$.

9. The method according to claim 7 wherein the base comprises KOH or $NH_4OH$.

10. The method according to claim 1 wherein the selectivity for silicon dioxide removal over silicon nitride removal is increased by increasing the concentration of the organic compound present during polishing.

11. A method of removing silicon dioxide in preference to silicon nitride from a surface of an article by chemical-mechanical polishing comprising polishing said surface using a polishing pad, water, abrasive particles selected from the group consisting of ceria and titania, and an organic compound comprising an α-amino acid.

12. The method according to claim 11 wherein the abrasive particles are ceria, the α-amino acid is L-proline, and the slurry has a pH within the range of from about 6 to about 11.

13. The method according to claim 11 wherein the abrasive particles are bonded to the polishing pad.

* * * * *